(12) United States Patent
Durazzo et al.

(10) Patent No.: US 11,550,696 B2
(45) Date of Patent: Jan. 10, 2023

(54) QUANTUM COMPUTE ESTIMATOR AND INTELLIGENT INFRASTRUCTURE

(71) Applicant: EMC IP Holding Company LLC, Hopkinton, MA (US)

(72) Inventors: Kenneth Durazzo, San Jose, CA (US); Seth Jacob Rothschild, Cambridge, MA (US); Victor Fong, Medford, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 28 days.

(21) Appl. No.: 16/917,036

(22) Filed: Jun. 30, 2020

(65) Prior Publication Data

US 2021/0406151 A1 Dec. 30, 2021

(51) Int. Cl.
*G06F 11/36* (2006.01)
*G06N 10/00* (2022.01)
*G06N 20/00* (2019.01)

(52) U.S. Cl.
CPC ......... *G06F 11/3612* (2013.01); *G06N 10/00* (2019.01); *G06N 20/00* (2019.01)

(58) Field of Classification Search
CPC .................................................. G06F 11/3612
See application file for complete search history.

(56) References Cited

U.S. PATENT DOCUMENTS

| | | | | |
|---|---|---|---|---|
| 8,818,988 | B1* | 8/2014 | Brown | G06F 16/217 |
| | | | | 707/719 |
| 10,997,519 | B2* | 5/2021 | Gunnels | G06F 9/5038 |
| 2002/0118700 | A1* | 8/2002 | Bruckman | H04L 47/24 |
| | | | | 370/460 |
| 2015/0286203 | A1* | 10/2015 | Stattelmann | G05B 19/0428 |
| | | | | 700/109 |
| 2017/0147303 | A1* | 5/2017 | Amy | G06F 8/436 |
| 2017/0223094 | A1* | 8/2017 | Johnson | G06N 10/00 |
| 2017/0357539 | A1* | 12/2017 | Dadashikelayeh | G06F 16/25 |
| 2018/0096085 | A1* | 4/2018 | Rubin | G16C 10/00 |
| 2018/0240032 | A1* | 8/2018 | van Rooyen | G06K 9/6297 |
| 2018/0293697 | A1* | 10/2018 | Ray | G06T 1/20 |
| 2019/0042677 | A1* | 2/2019 | Matsuura | G06N 10/20 |
| 2020/0104739 | A1* | 4/2020 | Sharma | G06F 16/904 |
| 2020/0159586 | A1* | 5/2020 | Chandramoorthy | G06F 9/4806 |
| 2020/0218787 | A1* | 7/2020 | Doi | G06F 30/3308 |

* cited by examiner

*Primary Examiner* — Jae U Jeon
(74) *Attorney, Agent, or Firm* — Workman Nydegger

(57) ABSTRACT

One example method includes evaluating code of a quantum circuit, estimating one or more runtime statistics concerning the code, generating a recommendation based on the one or more runtime statistics, and the recommendation identifies one or more resources recommended to be used to execute the quantum circuit, checking availability of the resources for executing the quantum circuit, allocating resources, when available, sufficient to execute the quantum circuit, and using the allocated resources to execute the quantum circuit.

20 Claims, 3 Drawing Sheets

US 11,550,696 B2

QUANTUM COMPUTE ESTIMATOR AND INTELLIGENT INFRASTRUCTURE

FIELD OF THE INVENTION

Embodiments of the present invention generally relate to quantum computing. More particularly, at least some embodiments of the invention relate to systems, hardware, software, computer-readable media, and methods for determining, for one or more particular tasks, whether real QPUs (quantum Processing Units) or simulation should be used to carry out the task.

BACKGROUND

While quantum computing technology shows promise, the technology is still relatively new and not well developed. Further, quantum computing may be well suited for some computing tasks, but not for others. As well, QPUs may be expensive to acquire and operate.

Due to these and/or other considerations, it may be difficult to predict hardware resource usage and runtime statistics. Correspondingly, it can be difficult to allocate resources for quantum computing clusters. As a final example, quantum algorithms may be challenging to develop, manage, and deploy.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings.

DETAILED DESCRIPTION OF SOME EXAMPLE EMBODIMENTS

Figure 1:
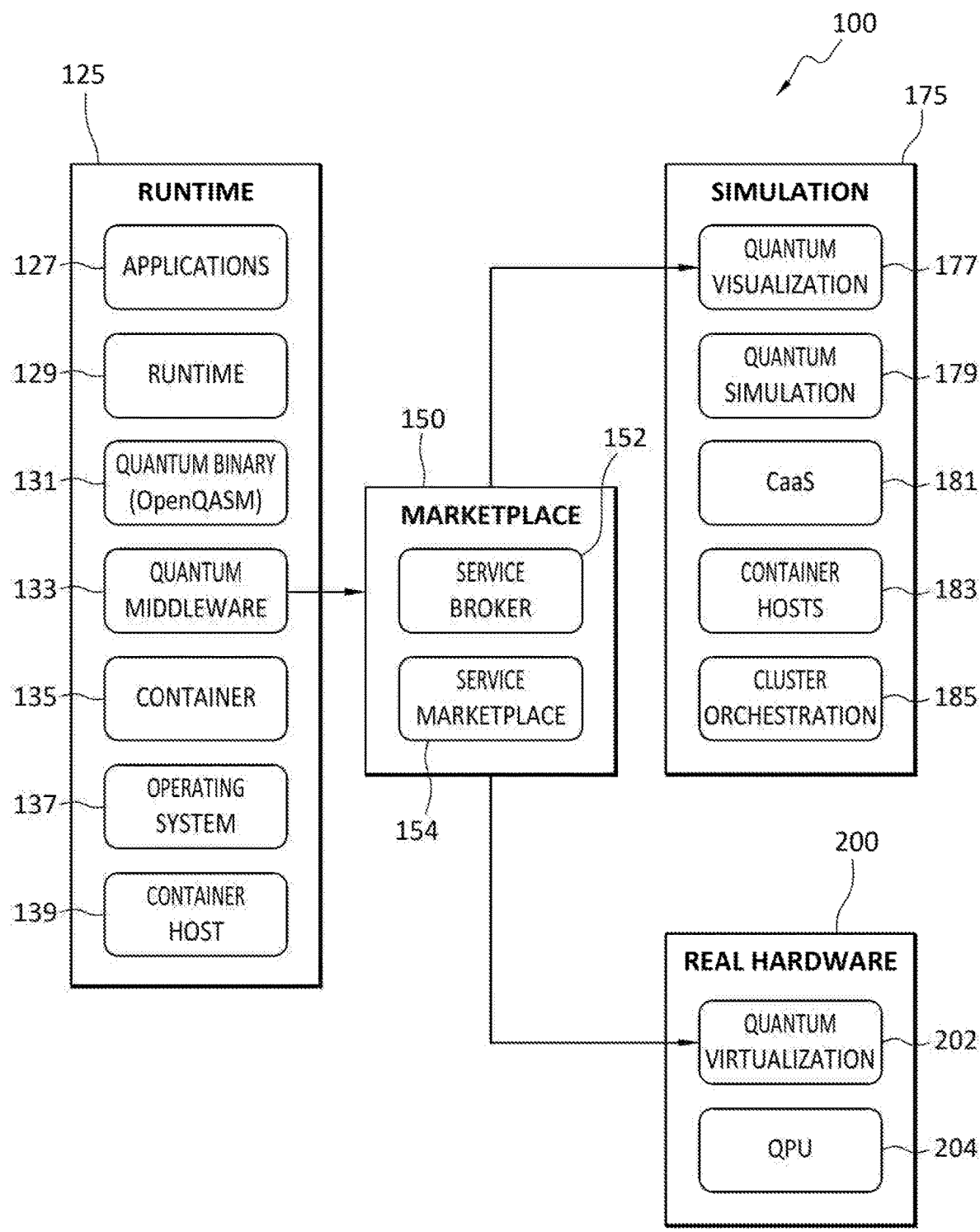
FIG. 1 discloses aspects of an example architecture.

Embodiments of the present invention generally relate to quantum computing. More particularly, at least some embodiments of the invention relate to systems, hardware, software, computer-readable media, and methods for determining, for one or more particular tasks, whether real QPUs (quantum Processing Units) or simulation should be used to carry out the task, and for allocating computing resources accordingly.

Embodiments of the invention may provide the abstraction for the infrastructure of a quantum computing platform that may offer end-to-end computing solutions with both real quantum processing units and quantum simulation clusters. As businesses begin writing their own quantum circuits, they may need a place to execute those circuits. The standard resource allocation infrastructure problems of the cloud have an added level of complexity due to QPU scarcity and availability of quantum simulation alternatives. As noted in further detail below, embodiments of the invention may employ a runtime statistics estimator to predict resource consumption of quantum circuits on different hardware, and then efficiently allocate clusters either in one datacenter or cross-datacenter.

In more detail, some example embodiments of the invention embrace a quantum computing platform that offers an end-to-end solution in which both real quantum processing units and quantum simulation clusters may be employed to perform computing tasks. The platform may behave in a similar fashion to, for example, other FaaS (Function as a Service), PaaS (Processing as a Service), or IaaS (Infrastructure as a Service) systems, at least to the extent that some embodiments may provide for the abstraction of an underlying physical and/or other infrastructure. In some particular embodiments, an estimator may be provided that may predict runtime statistics of quantum algorithms, including the execution time and memory space requirements. The information may then be transformed into a recommendation as to whether real QPUs, or simulation, should be used for one or more computing tasks. If the recommendation is to use simulation, one or more graphics processing units (GPU) may, or may not, be used, depending upon resource needs and resource availability.

Embodiments of the invention, such as the examples disclosed herein, may be beneficial in a variety of respects. For example, and as will be apparent from the present disclosure, one or more embodiments of the invention may provide one or more advantageous and unexpected effects, in any combination, some examples of which are set forth below. It should be noted that such effects are neither intended, nor should be construed, to limit the scope of the claimed invention in any way. It should further be noted that nothing herein should be construed as constituting an essential or indispensable element of any invention or embodiment. Rather, various aspects of the disclosed embodiments may be combined in a variety of ways so as to define yet further embodiments. Such further embodiments are considered as being within the scope of this disclosure. As well, none of the embodiments embraced within the scope of this disclosure should be construed as resolving, or being limited to the resolution of, any particular problem(s). Nor should any such embodiments be construed to implement, or be limited to implementation of, any particular technical effect(s) or solution(s). Finally, it is not required that any embodiment implement any of the advantageous and unexpected effects disclosed herein.

In particular, one advantageous aspect of at least some embodiments of the invention is that quantum computing resources and/or quantum simulation may allocated and employed for one or more particular tasks in order to take best advantage of the strengths of each type of computing. An embodiment may provide computing flexibility insofar as the embodiment may be configured to employ both real quantum processing units (QPU) and quantum simulation clusters, depending upon the particular circumstances. An embodiment may provide for automated allocation of resources such as QPU and quantum simulation clusters. An embodiment may provide for allocation of resources based on actual, and/or expected, usage of those resources.

A. Overview

The following is intended to provide context for aspects of one or more example embodiments of the invention. This discussion is not intended to limit the scope of the invention, or the applicability of the embodiments, in any way.

In general, quantum computation may be considered as the study of using quantum mechanical systems to solve problems. Scientists have not only built a theoretical model of how to perform quantum computations, but they have also engineered physical machines which have the necessary properties to perform those computations. These physical machines, which may be referred to as Quantum Processing Units (QPUs), may be able to construct and manipulate a quantum state in a controlled way, so as to perform computing tasks for example. While large, fault-tolerant computers that could factor composite numbers and break encryption in polynomial time (Shorn algorithm) may still lie in the future, small scale non-fault-tolerant computers are quickly becoming available and are quickly picking up attention in the software industry.

Although QPUs may not outperform CPUs (Central Processing Unit) for many tasks, QPUs may potentially be much better at solving certain problems. In such circumstances, a QPU may be employed as a co-processor for specific algorithms in the same way that GPUs and FPGAs (Field Programmable Gate Arrays) may be employed. Software frameworks may be employed for developers to define quantum circuits that can be executed on both real QPUs and/or on quantum simulation clusters.

At present, QPUs may be expensive to acquire and operate. On the other hand, quantum computing simulations may substantially less expensive but only to a point. To illustrate with an example, in order to store the data of n qubits by simulation, roughly $2^n$ bits would be needed. In other words, simulation of certain quantum circuits may quickly become very expensive, possibly to the point of impracticality. Potentially, simulated gate operations may require a lot of parallel processing, so GPUs may be used as accelerators in simulations. Today, there is no end-to-end, on-premise, quantum computing solution.

Embodiments of the invention may be effective in providing solutions to various problems, examples of which are discussed hereafter. One of such problems concerns hardware resource and runtime statistics prediction for quantum computing and simulation. When using a real QPU, quantum algorithms may have to wait in a queue to be executed one after the other. Notably, if a circuit claims to use a qubit, then it is expected that qubit will be in use until the circuit is done executing the quantum algorithm. Thus, embodiments of the invention may provide for a quantum computing platform that is configured to, and does, provide an estimated wait time for jobs in a queue. In this way, such embodiments may establish reasonable expectations as to when a quantum algorithm may be expected to begin, and complete, execution.

Embodiments of the invention may be effective in addressing hardware resource allocation for quantum computing simulations. To illustrate, quantum computing simulations may require significant processing, memory, bandwidth, and/or storage, resources, for example. However, it may be unlikely that a quantum simulation cluster is consistently using the same amount of resources, since different quantum circuits may require different amount of resources based on the number of qubits consumed by the quantum circuits. When a computing cluster does not have enough resources, it may not be able to execute quantum computing jobs. On the other hand, when a computing cluster has excess resources that it is not consuming, the computing cluster may be preventing other use cases from being executed. Thus, embodiments of the invention may provide for a mechanism to dynamically allocate one or more resources for quantum computing clusters based on usage, rather than employing a static resource allocation process. Moreover, because each iteration of quantum algorithm development may impact the number of qubits required for execution of the updated algorithm, embodiments of the invention may determine the resources required by the algorithm prior its execution, so that those resources can be allocated accurately.

As a final example, embodiments of the invention may be effective in addressing container development, management and deployment. For example, as QPUs may not necessarily serve as replacements of CPUs, quantum algorithms may be combined with traditional programming languages, such as C/C++, and Python, for example, and then be executed as part of a larger application. Thus, challenges with traditional software development may still apply to quantum computing software, such as code development, management and deployment. One or more of such challenges may be resolved by one or more embodiments of the invention.

Embodiments of the invention may be employed with various data. As used herein, the term 'data' is intended to be broad in scope. Thus, that term embraces, by way of example and not limitation, data segments such as may be produced by data stream segmentation processes, data chunks, data blocks, atomic data, emails, objects of any type, files of any type including media files, word processing files, spreadsheet files, and database files, as well as contacts, directories, sub-directories, volumes, and any group of one or more of the foregoing.

Example embodiments of the invention may be applicable to any system capable of storing and handling various types of objects, in analog, digital, or other form. Although terms such as document, file, segment, block, or object may be used by way of example, the principles of the disclosure are not limited to any particular form of representing and storing data or other information. Rather, such principles are equally applicable to any object capable of representing information.

In connection with this disclosure, various terms may be employed. Definitions for some of such terms are set forth in the Glossary below.

| Term | Definition |
| --- | --- |
| Qubit | A qubit is a two-dimensional complex vector with norm 1. In English, a qubit is the analog of the bit for classical computation. Unlike classical bits, qubits have special properties which allows for creation of algorithms which have quantum speedup in solving certain problems. When qubits are read, superposition and entanglement data is collapsed to a 0 or 1 in a probabilistic way. |
| Quantum Speedup | Existence of a quantum algorithm which is provably faster than known classical algorithms. For example, Shor's Algorithm is exponentially faster at factoring numbers than General Number Field Sieve which is the fastest classical algorithm. |
| Quantum Circuit | A collection of Qubits and Quantum Gates in a particular order. This may be compiled for execution on a quantum computer or compiled for quantum simulation. |
| Quantum Simulation | Executing a quantum circuit on classical hardware like a CPU or GPU. This may not exhibit quantum speedup, but it may allow a developer to see simulated intermediate quantum states they ordinarily may be unable to extract. |

B. Aspects of an Example Architecture

With particular attention now to FIG. 1, one example of an operating environment for embodiments of the invention is denoted generally at 100. In general, the operating environment 100 may comprise a runtime cluster 125, a marketplace 150, a quantum simulation cluster 175, and a real hardware group 200. These, and any other, components of the operating environment 100 need not be located, hosted, or run, at any particular location, site, or entity.

The runtime cluster 125 may comprise, for example, one or more applications 127, runtime module, system, information and parameters 129 (which may be collectively referred to as 'runtime environment'), OpenQUASM 131 (Open Quantum Assembly Language). The runtime environment 129 may also include a runtime statistic estimator module, which may also be referred to herein simply as an 'estimator,' discussed in further detail elsewhere herein. The runtime cluster 125 may further comprise quantum middleware 133, one or more container images such as an image of the container 135, an OS (operating system) 137, and a container host 139. The marketplace 150, which may communicate with the quantum middleware 133, may comprise a service broker 152, and middleware 154. The quantum simulation cluster 175 may comprise a quantum virtualization module 177, a quantum computing simulation module 179, a CaaS (Computing as a Service) module 181, one or more container hosts 183, and a cluster orchestration module 185. Finally, the real hardware group 200 may comprise any hardware needed to carry out any computing processes, and computing related processes. Examples of computing entity hardware are disclosed elsewhere herein. Further, the real hardware group 200 may be abstracted by a quantum virtualization module 202. That is, a representation of hardware of the real hardware group 200 may be created, and presented to a user, by the quantum virtualization module 202. Thus, one example of real hardware that may be virtualized by a quantum virtualization module 202 is one or more QPUs 204 (Quantum Processing Unit). Finally, and as indicated in FIG. 1, the marketplace module 150 may communicate with the real hardware 200 and quantum simulation cluster 175 and, particularly, the marketplace module 150 may communicate with the quantum virtualization module 177 and the quantum virtualization module 202. More detailed aspects of the operating environment 100 are discussed below.

C. Operational Aspects of Some Example Embodiments

In general, a quantum DevOps engineer may proceed through the following processes in a software development cycle for applications that may employ quantum computing, where such a cycle may include stages for writing, testing, and deployment of quantum code. More, fewer, and/or different, software development processes may be employed however. Initially, the process may being with software development and containerization. For example, the DevOps engineer may begin by creating quantum code written in traditional programming language, such as C/C++, or Python, for example. After the software is created and configured, the DevOps engineer may create a container image using Docker, or any other container image management framework. In accordance with some example embodiments, a base container image, such as an image of the container 135 may include one, some, or all, elements of a quantum runtime group such as the quantum runtime group 125, such as the quantum middleware 133 for example. The container 135 may be constructed and upload to a container image repository. In some embodiments, an example container image repository may comprise, or consist of, the service marketplace 154.

With continued reference to FIG. 1, and the service marketplace 154 in particular, embodiments of the invention may be implemented on top of existing 'X . . . as a Service' platforms such as PaaS, CaaS, or FaaS platforms, examples of which include, but are not limited to, Cloud Foundry, Kubernetes, and KNative. Once the container is uploaded to a container image repository, the DevOps engineer may go into the marketplace 150 to take the service(s) available that best match her need. Depending on the service marketplace 150 that is used, the service broker 152 may be employed. Different service broker APIs, such as and Open Service Broker API for example, may be available for platform teams to define their services in a marketplace, such as the service marketplace 154 for example, and to offer those services to customers. Thus, the service broker 152 may act to make services in the service marketplace 154 available to customers.

The service execution behavior obtained by the user may be based on the service, or group of services, chosen by the user for their computing tasks that need to be performed. For example, the user might choose a service level that would only offer quantum simulation, or a service level that may allow the user to specific a monthly service budget. Some services may be relatively more dynamic and may allow the system, which may comprise the quantum simulation cluster 175 and the real hardware group 200, to decide whether to use QPU, GPU, CPU, or any combination of these.

When the container 135 and associated service(s) are ready, the services, which may be accessible by way of the service marketplace 150, may be executed for the benefit of a user that requested the service(s). At execution time, the runtime environment may interpret programming instructions which require, or would at least benefit form, the use of quantum computing. The programming instructions may be compiled, such as by a runtime compiler of the runtime cluster 125, into a binary, or digital, version of a quantum circuit.

Note that the quantum binary 131 comprises quantum code, rather than any hardware, although a quantum binary may also be referred to herein as a quantum circuit. Thus, as used herein, a 'quantum circuit' embraces an executable computational routine that may include one or more quantum operations which may be performed on quantum data such as qubits.

When the compilation is completed, the compiled quantum binary 131 may be transmitted to the quantum middleware 133, defined in the same container image, such as the container 135. The quantum middleware 133 may be implemented in different mechanisms, depending on considerations such as best practices and/or particular operating system such as, for example, Linux socket, or filesystem read/write. The quantum binary 131 may be transmitted to the quantum middleware 133 without regard to any particular embodiment of the quantum middleware 133. Based on the particular quantum computing service(s) bound to the container, the quantum middleware 133 may then operate to obtain the destination and credentials that enable the quantum computing service(s) to communicate with the quantum simulation cluster 175.

To briefly summarize some of the concepts addressed thus far, quantum code may be generated, such as by an engineer, that forms the basis of one or more services. This quantum code may also be referred to herein as 'software' or as a 'quantum algorithm.' A container may be created that includes the quantum code, and a container image of the container may be generated. The container image may be a binary that includes all the requirements needed to run the container, and may also include any associated metadata that describe the needs and capabilities of the container. The service(s) provided by the quantum code, and included in the container, may then be made available to users through a marketplace. When the quantum code is ready to be run, the runtime cluster may identify programming instructions in the quantum code which may require quantum computing. Such programming instructions may be compiled into a quantum circuit which may be executable, for example, by a QPU. Thus, the quantum circuit, when executed, may provide one or more services to a user.

With continued reference now to the example of FIG. 1, and associated processes, the estimator of the runtime cluster 125, may, based on information provided to it by the quantum middleware 133, estimate one or more runtime statistics for one or more quantum computing services, that is, the services provided as a result of execution of one or more quantum circuits. Such runtime statistics may include, but are not limited to, the execution time and memory space consumption for the quantum computing services. Such estimates may be based on historical information for the same, or similar, quantum computing services.

The estimator of the runtime cluster may be implemented in various ways and, depending on the platform and use case, different implementations may be chosen. Following is a discussion of two possible implementations, but the scope of the invention is not limited to those illustrative examples.

In one example implementation, an estimator may employ a bottom-up approach in which the estimator may scan through the quantum binary 131 code, that is, the code embodied by one or more quantum circuits, from bottom to top. For each instruction included in the code, the estimator may predict the time cost of that instruction, that is, the amount of time it will take to execute the instruction. The instruction costs may be summed to predict, for example, the time and/or memory space required by each quantum algorithm, that is, the code in the container 135. In cases where the quantum circuit will be run with quantum simulation, entanglement may be explicitly predicted from historical data.

Note that as used herein, 'entanglement' or 'quantum entanglement' refers to a physical phenomenon. Particularly, this physical phenomenon may occur when a group of two or more particles are related in some way such that the quantum state of a particle in the group cannot be described independently of the respective quantum states of the other particle(s) in the group. Such a relation may be, for example, the way in which particles are generated, interact with each other, and/or share spatial proximity with each other.

In another example implementation, an estimator may alternatively employ a top-down approach which may involve the use of machine learning (ML). In one embodiment of the top-down approach, the estimator may make one or more predictions based on previously defined ML models. These ML models may be trained by historical data from experimentations. Any embodiment of an estimator, including the aforementioned examples, may provide the quantum simulation cluster 175 with at least two predictions or inputs, namely, execution time for the quantum code, and memory space requirements for execution of the quantum code. Another input that may be generated by an estimator is processing requirements for execution of the quantum code. As noted earlier, the estimator may reside in the runtime cluster 125, although that is not necessarily required. Thus, the runtime cluster 125 may communicate directly with the quantum simulation cluster 175, and/or indirectly with the quantum simulation cluster 175, such as by way of the marketplace 150.

Using inputs, such as the two inputs from an estimator for example, a cluster orchestration module 185 of the quantum simulation cluster 175 may determine how to best execute the quantum algorithm based on available resource and user-chosen service plan. That is, the cluster orchestration module 185 may determine how to employ processing resources in the execution of the quantum algorithm. The determination may be optimal based on the expected availability of processing resources during the time when the quantum algorithm is to be run. In some embodiments, possible choices of processing resources may include, but are not limited to, QPUs, GPUs, and CPUs. The processing resources are not required to reside at any particular location. However, in some example embodiments, one or more QPUs may reside at a datacenter. As another example, one or more CPUs may reside on a laptop. It may be the case, in some circumstances at least, that the QPU is the most expensive processing resource, and may not always be available. Thus, when a real QPU is unavailable to support execution of a quantum algorithm, quantum computing simulation may be possible, depending upon the requirements of the quantum circuit to be executed. In such a case, a GPU may be an accelerated option, at least as compared to a CPU which may not run as quickly as a GPU. If GPU is not available, then a CPU may be employed as a fallback option. Thus, for quantum computing simulations, a hierarchy for the user of processors may be defined and employed.

In some embodiments, a quantum circuit may require more qubits for execution than are available. In such a case, the simulation cluster 175, which would otherwise execute the quantum circuit, may error out. In the case when the resources required for execution of quantum circuit fit within the total available resources, but some resources are consumed by another quantum circuit, the pending quantum circuit may enter a queue and return with a waiting-time estimation based on the jobs in front of it.

Suppose that there is a pool of processing resources, such as RAM, CPUs, and GPUs, available for different types of use cases, one of which is a quantum computing simulation. Based on the resource(s) required for the use cases, the cluster orchestration component 185 may reserve the necessary resource and orchestrate to create a simulation cluster, which may be an ad hoc simulation cluster specifically created for a particular quantum computing simulation job. The simulation cluster may be created by the cluster orchestration component 185 using the elements of the quantum simulation cluster 175. Once the simulation cluster is in place, the simulation cluster may then execute the quantum circuit. The resources that had been allocated for that quantum circuit may be released after execution of the quantum circuit.

With reference to the example architecture 100 of FIG. 1, further details are provided concerning cross datacenter orchestration. Particularly, the connection between the quantum middleware 133 and the quantum simulation cluster 175 may be implemented in various ways, examples of which include, but are not limited to, HTTP, TCP, pub/sub, and message bus. At least some connections may enable communications across the internet, so as to enable hybrid cloud orchestration. To illustrate, an application might be executed in an Azure cloud environment, which may comprise, or consist of, the runtime cluster 125. However, if GPUs are less expensive to use in an environment such as GCP (Google Cloud Platform) for example, the quantum simulation cluster may be orchestrated on GCP with quantum simulation jobs being transmitted across the internet from Azure to GCP.

D. Further Discussion of Aspects of Some Example Embodiments

Embodiments of the invention may comprise various features, components, and functionalities, although no embodiment is required to have any particular one of any of these. For example, some embodiments comprise an estimator that may be operable to predict runtime statistics for a quantum circuit, such as execution time and memory space required. Some embodiments may comprise a cluster orchestration engine that may be operable to dynamically allocate, and release, resources based on estimated resources required for quantum circuits, as determined by an estimator for example. One or more embodiments may implement dynamic resource allocation in quantum simulation by way of a cluster orchestration engine that may employ execution data, such as entanglement from quantum simulation, to dynamically allocate, and release, CPU and GPU resources for quantum simulation processes. Embodiments of the invention may provide for service-based quantum execution environment with full resource utilization. Particularly, such embodiments may adjust resource consumption based on actual qubit usage by quantum circuits, so that the user would not need to adjust a service level when software changes, or there are qubits that are unused by a quantum circuit. An embodiment of the invention may provide for fast error prediction on quantum circuits. Particularly, an embodiment may error out if a determination is made that there will not be sufficient resources to execute a quantum circuit, thus saving time for both the author of that circuit and for other users waiting for available resources. Further, embodiments of the invention may provide for container-based quantum code deployment with a pass-through OS layer. That is, such embodiments may enable the deployment of quantum code using containers. The code may then be executed in a special environment through the use of runtime and middleware according to various example embodiments. An embodiment of the invention may provide for hybrid-cloud orchestration for quantum compute processes. For example, by having de-coupled a container orchestration environment and quantum computing execution environment, a hybrid or multi-cloud orchestration model may be possible.

Following is a brief illustration of how some embodiments of the invention may behave. One such embodiment concerns multi-cloud quantum execution. Particularly, by utilizing an embodiment of the invention, an enterprises may set up quantum execution environments with both real QPUs and quantum simulation clusters. The quantum simulation clusters may be orchestrated dynamically and share resource with other use cases, such as cloud native applications, AI (Artificial Intelligence), and ML (Machine Learning), for example). Further, a service provider may set up a service plan for customers and then charge back according to the customer use cases. Finally, when private datacenters are running out of resources to service quantum computing workloads, those workloads may burst out into public clouds and other private datacenters.

E. Example Methods

Figure 2:
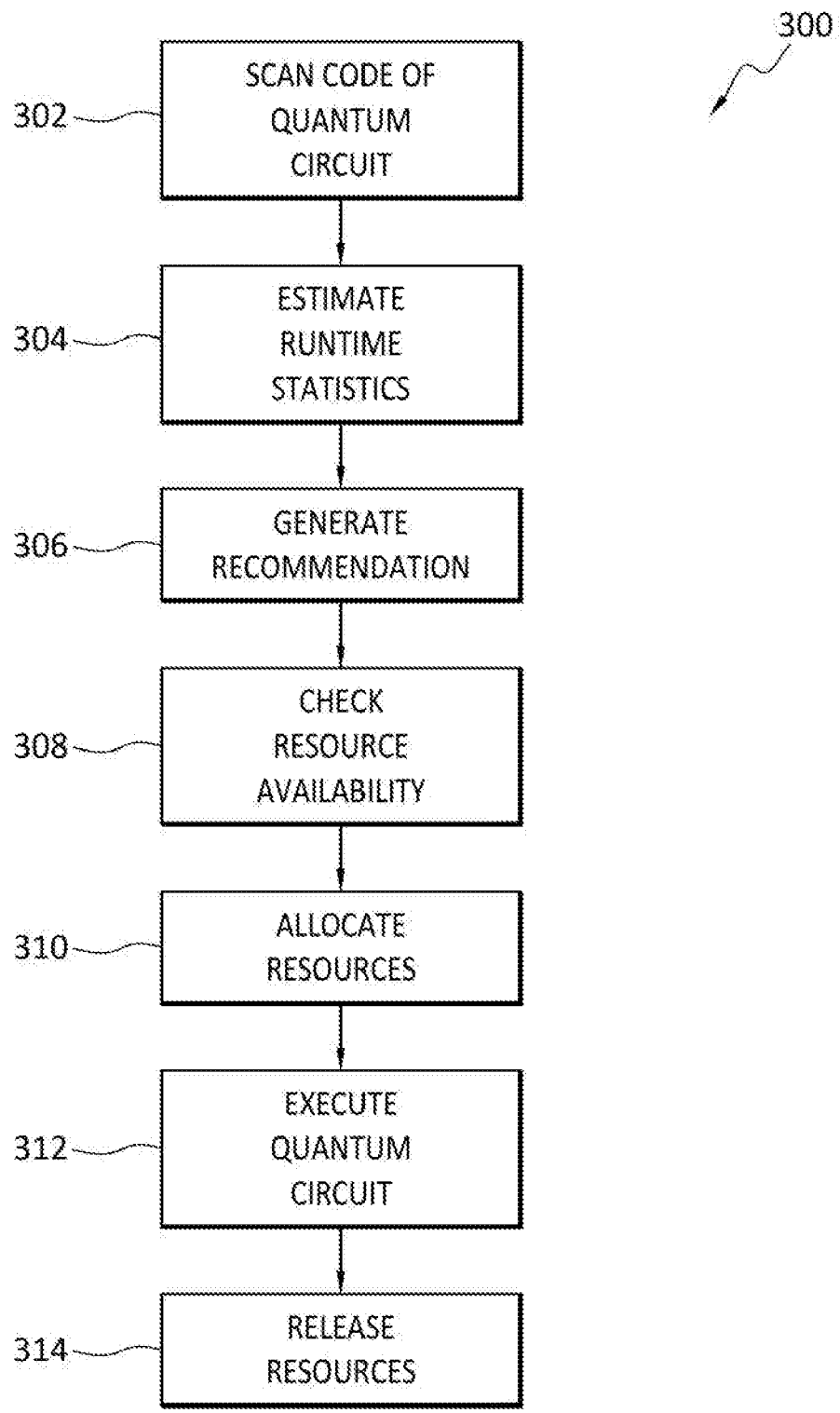
FIG. 2 discloses aspects of an example method.

Attention is directed now to FIG. 2, where methods are disclosed for the implementation and use of a quantum computing platform that may comprise both real QPUs and quantum simulation clusters, where one example method is denoted generally at 300. It is noted with respect to the example method of FIG. 2, as well as to any of the other disclosed processes, operations, methods, and/or any portion of any of these, may be performed in response to, as a result of, and/or, based upon, the performance of any preceding process(es), methods, and/or, operations. Correspondingly, performance of one or more processes, for example, may be a predicate or trigger to subsequent performance of one or more additional processes, operations, and/or methods. Thus, for example, the various processes that may make up a method may be linked together or otherwise associated with each other by way of relations such as the examples just noted.

In some embodiments, the example method 300 may be performed in whole, or in part, in a cloud computing environment. In some embodiments, any one or more parts of the method 300 may be performed on-premises at an enterprise, while any one or more parts of the method 300 may be performed in a cloud computing environment. More generally however, the example method 300, and portions thereof, need not be performed by any particular entity, or group of entities, nor be performed at any particular site(s).

The example method 300 may begin with the scanning 302 of the code of a quantum circuit. Based on the scanning 302 of the code, an estimate may then be generated 304 of one or more runtime statistics implicated by the code. Such runtime statistics may comprise, for example, the amount of time needed for execution of the quantum circuit, and memory space requirements for execution of the quantum circuit. Such memory space requirements may identify, for example, an amount of RAM needed to support execution of the quantum circuits.

Based on the outcome of the estimating process 304, a recommendation may then be generated 306 as to whether, for example, one or more QPUs should be used to execution the quantum circuit or, alternatively, whether a quantum simulation should be employed for execution of the quantum circuit. In some embodiments, the recommendation that is generated 306 may indicate that execution of the quantum circuit should be split between one or more QPUs and a quantum simulation process.

After the recommendation is generated 306, a check may be performed 308 to determine whether adequate resources, such as QPUs, memory space, processing resources, and/or, quantum simulation resources, will be available when needed to execute the quantum circuit. If adequate resources will not be available, the method 200 may terminate and the next quantum circuit in a queue may be scanned 302.

On the other hand, if adequate resources will be available to execute the quantum circuit, those resources may be allocated 310 for execution of the quantum circuit. Using the allocated resources, the quantum circuit may then be executed 312. After the quantum circuit has been executed 312, the resources that were employed for execution of the quantum circuit may then be released 314 and made available for another process.

F. Further Example Embodiments

Following are some further example embodiments of the invention. These are presented only by way of example and are not intended to limit the scope of the invention in any way.

Embodiment 1. A method, comprising evaluating code of a quantum circuit; estimating one or more runtime statistics concerning the code; generating a recommendation based on the one or more runtime statistics, and the recommendation identifies one or more resources recommended to be used to execute the quantum circuit; checking availability of the resources for executing the quantum circuit; allocating resources, when available, sufficient to execute the quantum circuit; and using the allocated resources to execute the quantum circuit.

Embodiment 2. The method as recited in embodiment 1, wherein the one or more runtime statistics comprise an amount of time needed to execute the quantum circuit, and/or an amount of memory space needed to execute the quantum circuit.

Embodiment 3. The method as recited in any of embodiments 1-2, wherein evaluating the code comprises scanning the code in a bottom-up manner to determine a time cost of each instruction of the code.

Embodiment 4. The method as recited in any of embodiments 1-3, wherein evaluating the code comprises using a machine learning model to determine a time cost of each instruction of the code.

Embodiment 5. The method as recited in any of embodiments 1-4, wherein the recommendation specifies either that: one or more QPUs are recommended for executing the quantum circuit; or, a quantum computing simulation is recommended for executing the quantum circuit.

Embodiment 6. The method as recited in any of embodiments 1-5, wherein when inadequate resources are available to execute the quantum circuit, the quantum circuit is removed from a queue.

Embodiment 7. The method as recited in any of embodiments 1-6, wherein the quantum circuit is executed as part of a containerized service that is being provided to a user.

Embodiment 8. The method as recited in any of embodiments 1-7, wherein execution of the quantum circuit is performed at a cloud computing site.

Embodiment 9. The method as recited in any of embodiments 1-8, wherein execution of the quantum circuit is performed by a quantum computing cluster.

Embodiment 10. The method as recited in any of embodiments 1-9, wherein execution of the quantum circuit is performed by one or more QPUs.

Embodiment 11. A method for performing any of the operations, methods, or processes, or any portion of any of these, disclosed herein.

Embodiment 12. A non-transitory storage medium having stored therein instructions that are executable by one or more hardware processors to perform operations comprising the operations of any one or more of embodiments 1 through 11.

G. Example Computing Devices and Associated Media

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Embodiments of the invention may also employ various quantum components, examples of which are disclosed herein. Such quantum components comprise, for example, qubits, and QPUs. Quantum components may comprise hardware and/or software.

Computer-executable instructions may comprise, for example, instructions and data which, when executed, cause a general purpose computer, special purpose computer, or special purpose processing device to perform a certain function or group of functions. As such, some embodiments of the invention may be downloadable to one or more systems or devices, for example, from a website, mesh topology, or other source. As well, the scope of the invention embraces any hardware system or device that comprises an instance of an application that comprises the disclosed executable instructions.

Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term 'module' or 'component' may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

Figure 3:
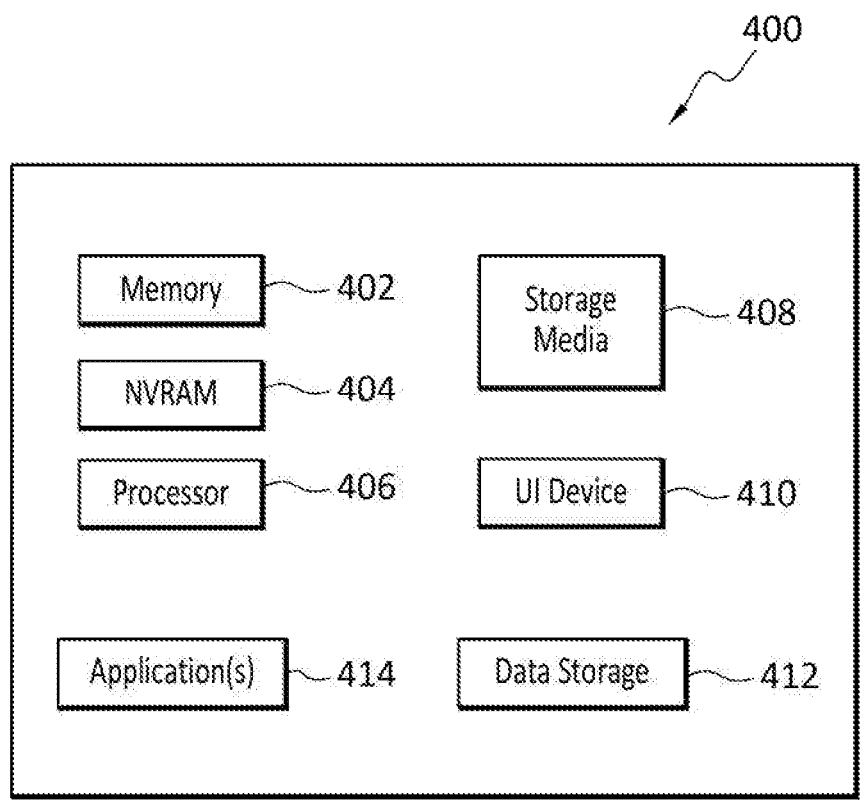
FIG. 3 discloses aspects of an example computing entity.

With reference briefly now to FIG. 3, any one or more of the entities disclosed, or implied, by FIGS. 1-2 and/or elsewhere herein, may take the form of, or include, or be implemented on, or hosted by, a physical computing device, one example of which is denoted at 400. As well, where any of the aforementioned elements comprise or consist of a virtual machine (VM), that VM may constitute a virtualization of any combination of the physical components disclosed in FIG. 3. Similarly, a quantum virtualization of one or more quantum computing elements, such as QPU hardware for example, may be employed in one or more embodiments.

In the example of FIG. 3, the physical computing device 400 includes a memory 402 which may include one, some, or all, of random access memory (RAM), non-volatile random access memory (NVRAM) 404, read-only memory (ROM), and persistent memory, one or more hardware processors 406, non-transitory storage media 408, UI device 410, and data storage 412. One or more of the memory components 402 of the physical computing device 400 may take the form of solid state device (SSD) storage. As well, one or more applications 414 may be provided that comprise instructions executable by one or more hardware processors 406 to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud storage site, client, datacenter, or backup server, to perform any of the functions disclosed herein. As well, such instructions may be executable to perform any of the other operations and methods, and any portions thereof, disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, comprising:
evaluating code of a quantum circuit;
estimating one or more runtime statistics concerning the code of the quantum circuit;
generating a recommendation based on the one or more estimated runtime statistics, wherein the one or more estimated runtime statistics comprise an amount of time needed to execute the quantum circuit, and/or an amount of memory space needed to execute the quantum circuit and the recommendation identifies one or more resources recommended to be used to execute the quantum circuit;
checking availability of the resources for executing the quantum circuit;
based on the estimated runtime statistics, allocating resources, when available, sufficient to execute the quantum circuit; and
using the allocated resources to execute the quantum circuit.

2. The method as recited in claim 1, wherein the recommendation that is generated indicate that execution of the quantum circuit should be split between one or more quantum processing units and a quantum simulation process.

3. The method as recited in claim 1, wherein evaluating the code comprises scanning the code in a bottom-up manner to determine a time cost of each instruction of the code.

4. The method as recited in claim 1, wherein evaluating the code comprises using a machine learning model to determine a time cost of each instruction of the code.

5. The method as recited in claim 1, wherein the recommendation specifies either that: one or more quantum processing units are recommended for executing the quantum circuit; or, a quantum computing simulation is recommended for executing the quantum circuit.

6. The method as recited in claim 1, wherein when inadequate resources are available to execute the quantum circuit, the quantum circuit is removed from a queue.

7. The method as recited in claim 1, wherein the quantum circuit is executed as part of a containerized service that is being provided to a user.

8. The method as recited in claim 1, wherein execution of the quantum circuit is performed at a cloud computing site.

9. The method as recited in claim 1, wherein execution of the quantum circuit is performed by a quantum computing cluster.

10. The method as recited in claim 1, wherein execution of the quantum circuit is performed by one or more quantum processing units.

11. A non-transitory storage medium having stored therein instructions that are executable by one or more hardware processors to perform operations comprising:
evaluating code of a quantum circuit;
estimating one or more runtime statistics concerning the code of the quantum circuit;
generating a recommendation based on the one or more estimated runtime statistics, wherein the one or more estimated runtime statistics comprise an amount of time needed to execute the quantum circuit, and/or an amount of memory space needed to execute the quantum circuit and the recommendation identifies one or more resources recommended to be used to execute the quantum circuit;
checking availability of the resources for executing the quantum circuit;
based on the estimated runtime statistics, allocating resources, when available, sufficient to execute the quantum circuit; and
using the allocated resources to execute the quantum circuit.

12. The non-transitory storage medium as recited in claim 11, wherein the recommendation that is generated indicates that execution of the quantum circuit should be split between one or more quantum processing units and a quantum simulation process.

13. The non-transitory storage medium as recited in claim 11, wherein evaluating the code comprises scanning the code in a bottom-up manner to determine a time cost of each instruction of the code.

14. The non-transitory storage medium as recited in claim 11, wherein evaluating the code comprises using a machine learning model to determine a time cost of each instruction of the code.

15. The non-transitory storage medium as recited in claim 11, wherein the recommendation specifies either that: one or more quantum processing units are recommended for executing the quantum circuit; or, a quantum computing simulation is recommended for executing the quantum circuit.

16. The non-transitory storage medium as recited in claim 11, wherein when inadequate resources are available to execute the quantum circuit, the quantum circuit is removed from a queue.

17. The non-transitory storage medium as recited in claim 11, wherein the quantum circuit is executed as part of a containerized service that is being provided to a user.

18. The non-transitory storage medium as recited in claim 11, wherein execution of the quantum circuit is performed at a cloud computing site.

19. The non-transitory storage medium as recited in claim 11, wherein execution of the quantum circuit is performed by a quantum computing cluster.

20. The non-transitory storage medium as recited in claim 11, wherein execution of the quantum circuit is performed by one or more quantum processing units.

* * * * *